United States Patent [19]

Kawase et al.

[11] Patent Number: 5,006,143
[45] Date of Patent: Apr. 9, 1991

[54] METHOD OF PRODUCING A JOINED ARTICLE THROUGH BONDING WITH LOW MELTING POINT GLASS

[75] Inventors: Hideyuki Kawase; Noboru Sahashi; Tamotsu Hashizume

[73] Assignee: NGB Spark Plug Co., Ltd., Aichi, Japan

[21] Appl. No.: 596,414

[22] Filed: Oct. 12, 1990

Related U.S. Application Data

[63] Continuation of Ser. No. 335,325, Apr. 10, 1989, abandoned.

[30] Foreign Application Priority Data

Apr. 11, 1988 [JP] Japan .................................. 63-88547

[51] Int. Cl.⁵ .......................... C03B 29/00; C03C 29/00
[52] U.S. Cl. .......................................... 65/43; 65/59.1; 65/59.4; 65/59.5
[58] Field of Search ...................... 65/36, 42, 43, 59.1, 65/59.3, 59.4, 59.5

[56] References Cited

U.S. PATENT DOCUMENTS

| | | | |
|---|---|---|---|
| 3,177,576 | 4/1965 | Kuzminski | 65/43 X |
| 3,325,586 | 6/1967 | Suddick | 65/43 X |
| 3,560,180 | 2/1971 | Merat | 65/59.3 X |
| 3,669,715 | 6/1972 | Meyer | 65/43 X |
| 3,768,991 | 10/1973 | Rogers | 65/59.3 X |
| 4,676,816 | 6/1987 | Fick | 65/43 |

*Primary Examiner*—Robert L. Lindsay
*Attorney, Agent, or Firm*—Finnegan, Henderson, Farabow, Garrett, and Dunner

[57] ABSTRACT

A method of joining a number of articles using a low-melting point glass whereby recesses in the layer of low-melting point glass initially formed before joining reduces the entrapment of bubbles within the glass layer. Preferably, the recesses are formed by protrusions in a mask used to form the coating of low-melting point glass prior to bonding.

6 Claims, 4 Drawing Sheets

METHOD OF PRODUCING A JOINED ARTICLE THROUGH BONDING WITH LOW MELTING POINT GLASS

This application is a continuation of application Ser. No. 335,325, filed April 10, 1989, now abandoned.

BACKGROUND OF THE INVENTION

The present invention relates to a method of producing a joined body, with low-melting glass.

A large number of articles are formed from component parts by using a low-melting glass as a bonding material. An example of an article bonded with low-melting glass is an IC chip (a semiconductor device having an integrated circuit formed therein) mounted on a ceramic substrate sealed with a ceramic cap together with lead wires acting as external connection terminals. A particular type of such a package is termed a "cer-dip."

In order to produce such a cer-dip, first, lead wires are mounted on peripheral portions of a main surface of a ceramic substrate on which low-melting glass has been applied and baked. A conductive material (for example, a silver plated plate or the like) on which low-melting glass has been applied and baked is mounted in a recess in the ceramic substrate disposed to receive an IC chip. Thereafter, the low-melting glass is heated so that the conductive material and the lead wires are bonded to the ceramic substrate.

Thereafter, an IC chip is mounted on the conductive material by means of soldering, and wire-bonding is performed between the chip and the lead wires. Lastly, a ceramic cap on which the low-melting glass has been applied and baked is bonded to the ceramic substrate so as to seal the ceramic substrate to complete the process. FIG. 13 shows a flow chart of this process.

In such an article in which bonding is performed by heating baked low-melting glass, however, bubbles (voids in the glass) are generated in the low-melting glass during bonding.

The generation of such bubbles causes problems because they reduce the thermal conductivity between the silver plated plate and the ceramic substrate. This may cause defective soldering of the IC chip to the silver plated plate and, in addition, heat from the IC chip is not effectively conducted away from the package during use of the device. Furthermore, there is a risk of causing leakage in the cap seal between the ceramic substrate and the ceramic cap.

An object of the present invention is therefore to provide a method of producing a joined body through low-melting glass bonding in which bubbles generated during bonding by heating the low-melting glass can be reduced.

SUMMARY OF THE INVENTION

To achieve these and other objects of the invention there is provided a method of joining two articles by means of a low-melting point glass. The method comprises the steps of first providing a first article to be joined. The first article has a first bonding surface. A layer of low-melting point glass is applied to the first bonding surface with the layer having a plurality of recesses in the outer peripheral edge thereof. A second article to be bonded is applied to the layer of low-melting point glass. The first and second articles and the layer of low-melting point glass are heated to a temperature above the melting point of the glass. The glass is then solidified to join the first and second articles. Preferably, the recesses formed in the layer of low-melting point glass reduce the thickness of the low-melting point glass layer adjacent the outer peripheral edge of that layer. It is further preferred that the method include the step of applying the low-melting point glass using a mask member to form the glass layer where the glass member includes at least one protrusion disposed to form the recesses.

DESCRIPTION OF THE PREFERRED EMBODIMENTS

According to the present invention having such features as described above, the notched portions or the portions with reduced thickness are formed in the outer peripheral edge of the low-melting point glass before bonding is performed by heating the low-melting point glass. Therefore, any bubbles generated in the glass during the bonding escape from the notch portions thereby reducing occurrence of bubbles in the bonded article.

An embodiment of the method of producing a joined body through bonding with low-melting glass according to the present invention will be described with reference to the accompanying drawings.

Figure 1:
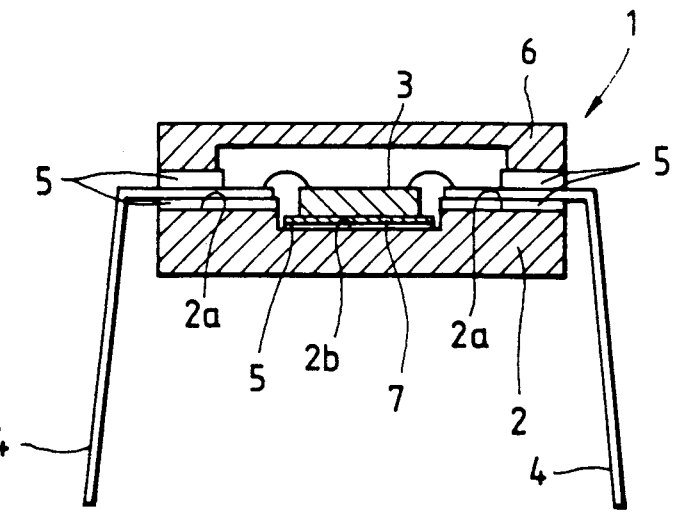
FIG. 1 is a cross-sectional view showing a bonded article such as a cer-dip.

FIG. 1 is a sectional view showing an IC package having a glass-sealed body using low-melting glass.

The package is produced in such a manner that an IC chip (a semiconductor device having an integrated circuit formed therein) 3 and lead wires 4 to be electrically connected to the IC chip 3 to act as external connection terminals are sealed with a ceramic cap 6 by use of low-melting glass 5 on a ceramic substrate 2. The ceramic components to be bonded according to the present invention consist essentially of alumina.

The low-melting glass 5, which functions as an insulator and an adhesive is repeatedly applied, for example in two, three or four layers, onto a lead-wire receiving surface 2a which is a peripheral portion of the ceramic substrate 2 and onto a rear surface (at the ceramic substrate 2 side) of a silver plated plate 7 which is a material to be bonded according to the present invention and is used as a conductive material of the IC chip 3 when the IC chip 3 is mounted. A conductor receiving portion 2b of the ceramic substrate 2 accommodates the silver plated plate 7. After the lead wires and metal plate are appropriately placed using the low-melting point glass of the present invention, the low-melting glass 5 is heated above its melting point.

Figure 2:
FIG. 2 is a sectional side view of a low-melting glass applied to a silver plate.

When the low-melting glass 5 melts in contact with the silver plated plate 7, the low-melting glass 5 rises at the peripheral portion of the silver Plated plate 7 owing to the surface tension of the low-melting glass 5 as shown in FIG. 2. This may be a factor of generation of bubbles (glass voids) when the silver plated plate 7 is bonded to the recess 2b of the ceramic substrate 2. This portion of the substrate ultimately receives the IC chips 3. If bonding is performed by using low-melting glass, bubbles are generated in the low-melting glass 5 during bonding, and therefore it is necessary to make any such bubbles escape.

Figure 3:
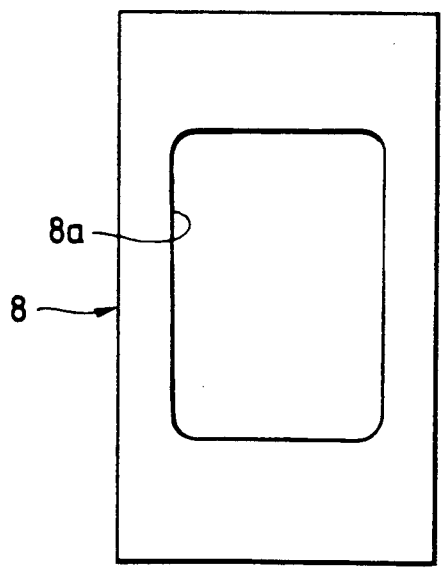
FIG. 3 is a plan view showing a conventional mask.
Figure 4:
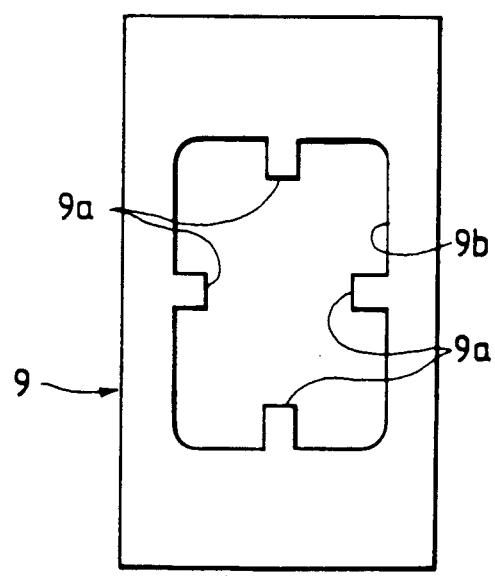
FIG. 4 is a plan view showing a special mask.
Figure 5:
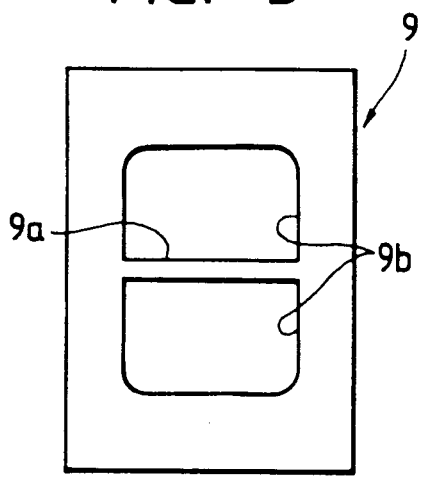
FIGS. 5 through 9 are plan views showing special masks having variously-shaped protrusions.
Figure 6:
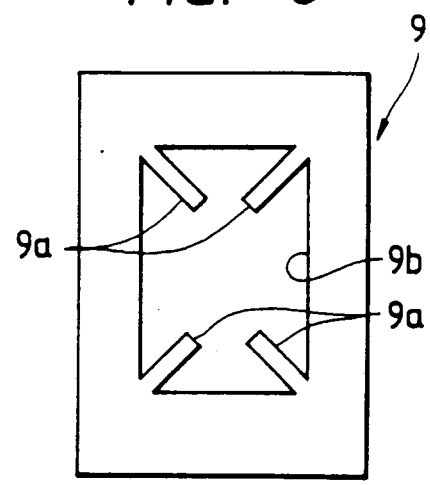

In this embodiment, therefore, when a coating of low-melting glass 5 is formed, the glass printing masks as shown in FIGS. 3 and 4 are used in combination or the glass printing mask of FIG. 4 is used singly. The glass printing mask of FIG. 3 is a conventional mask 8 having an opening 8a therein but the glass printing mask of FIG. 4 is a special mask 9 which has been invented to reduce the retention of bubbles. The special mask 9 has protrusions 9a formed at its inner peripheral portions for that purpose.

If the coating with the low-melting glass 5 is formed by using the mask 9, recess portions in the glass coating (not shown) which are the notched recess portions according to the present invention are formed corresponding to the protrusions 9a in the opening 9b of the mask 9 at the outer peripheral portions of the coating low-melting glass 5.

A low-melting glass (type LS-2001B) 5 was repeatedly applied onto the silver plated plate 7 in two layers by using the conventional mask 8 and the special mask 9 in combination in a manner as shown in Table 1. The low-melting glass 5 was then heated. Thereafter, the silver plated plate 7 was mounted on the recess portion 2b of the ceramic substrate 2 and the low-melting glass 5 was again heated so that the silver plated plate 7 was bonded to the ceramic substrate 2, Table 2 shows the measurement results of the rate of bubble generation.

TABLE 1

| Sample | Kind of Mask | | Baking Temperature |
|---|---|---|---|
| | First Layer | Second Layer | |
| A | conventional mask | special mask | 450° C. |
| B | special mask | special mask | 450° C. |
| C | special mask | conventional mask | 450° C. |
| D | conventional mask | conventional mask | 450° C. |

TABLE 2

| Sample | 1 | 2 | 3 | 4 | 5 | X | Min | Max |
|---|---|---|---|---|---|---|---|---|
| A | 1.4 | 0.9 | 0.9 | 0.9 | 1.4 | 1.1 | 0.9 | 1.4 |
| B | 3.7 | 3.7 | 3.7 | 3.7 | 2.3 | 3.4 | 2.3 | 3.7 |
| C | 4.6 | 4.6 | 1.9 | 5.1 | 5.1 | 4.3 | 1.9 | 5.1 |
| D | 4.6 | 7.4 | 5.6 | 5.6 | 8.3 | 6.3 | 4.6 | 8.3 |

The measurement of bubble generation (%) was determined by means of radiography on five pieces for every sample (A-D) which were produced with various combinations of the conventional mask 8 and the special mask 9. The amount of bubble generation shown in Table 2 being represented by the ratio of the sectional area of bubbles to the sectional area, in the direction of the main surface of the low-melting glass 5 applied on the silver plated plate 7.

In the measurement of the amount of bubble generation in the case where the low-melting glass 5 was applied onto the silver plated plate 7 by using the conventional mask 8 and the special mask 9 in combination as described above, the best measurement result was obtained when the conventional mask 8 and the special mask 9 were used in formation of the first and second layers on the silver plated plate 7 respectively as shown in the case of the sample A.

Next, the amount of bubble generation was measured in the case where the protrusions 9a of the special mask 9 were changed in shape in the combination of masks (the conventional mask 8 and the special mask 9 being used for formation of the first and second layers respectively) used to obtain the sample A in which the best results were obtained. Table 3 shows the measurement results.

Five kinds of samples of the special mask 9 having variously shaped protrusions 9a formed as shown in FIGS. 5 through 9 were prepared, and measurement was performed by use of those masks. The sample 1, 2, 3, 4 and 5 are shown in FIG. 5, FIG. 6, FIG. 7, FIG. 8, and FIG. 9, respectively.

TABLE 3

| Sample | Amount of Bubble Generation (%) | | | | X |
|---|---|---|---|---|---|
| 1 | 0.9 | 2.8 | 2.8 | 0.9 | 2.10 |
| 2 | 3.2 | 2.3 | 1.4 | 2.8 | 2.43 |
| 3 | 0.0 | 0.9 | 1.4 | 0.0 | 0.58 |
| 4 | 0.9 | 0.9 | 0.5 | 0.7 | 0.75 |
| 5 | 1.9 | 1.9 | 4.6 | 3.7 | 3.03 |

Figure 7:
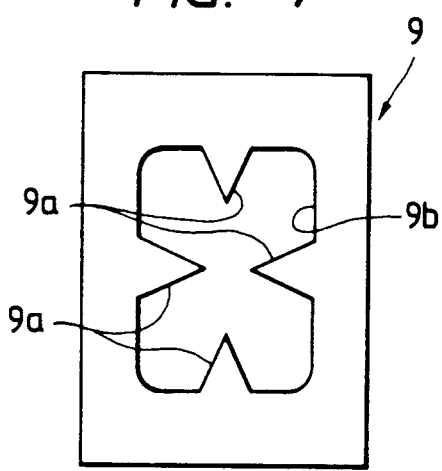
Figure 8:
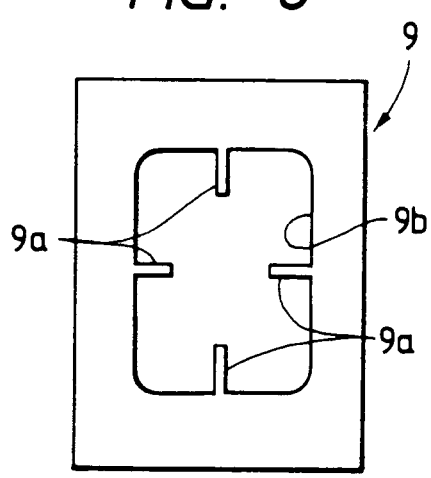
Figure 9:
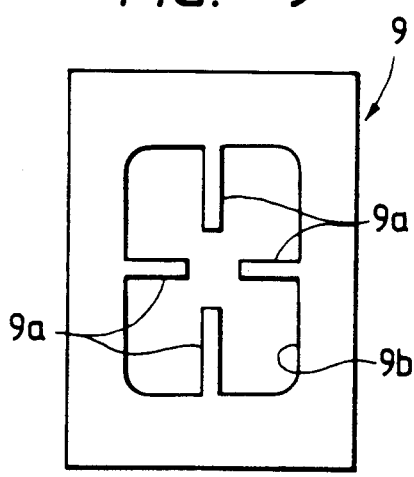

As seen from Table 3, the amount of bubble generation was small in all the samples in comparison with the samples in which only the conventional mask was used, and good measurement results were obtained especially in the sample 3 of FIG. 7 and in the sample 4 of FIG. 8.

As apparent from the foregoing measurement results of the amount of bubble generation, in the case where coating with the low-melting glass 5 is performed by use of the special mask 9 having the protrusions 9a formed thereon, recess portions are formed in the outer peripheral portions of the low-melting glass coating 5. These recesses act as gas escape grooves for bubbles generated when bonding of the silver plated plate 7 is performed, so that the amount of bubbles generated is lowered.

Although the glass printing mask is used to form the recess portions in the outer peripheral portions of the low-melting glass 5 in the foregoing embodiment, it would also be possible to cut the coating at the appropriate locations to form such recessed portions.

Further, although measurement was made as to the bubbles generated when the silver plated plate 7 was bonded in the above embodiment, the amount of bubble generation can be reduced by using the special mask 9 on the surface on which the lead wires 4 are to be attached. This will be proved in the following embodiment.

Figure 10:
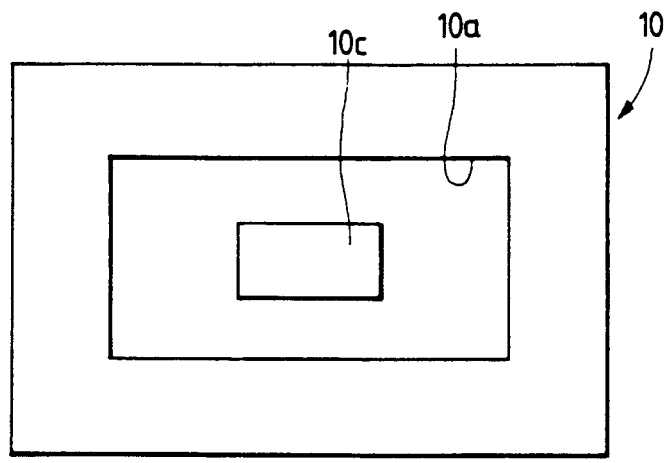
FIG. 10 is a plan view of a conventional mask which has been used for applying low-melting glass onto a lead attaching surface.
Figure 11:
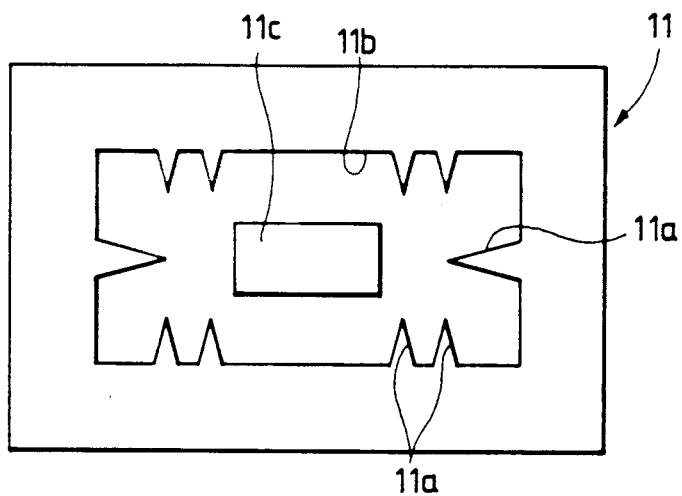
FIGS. 11 and 12 are plan views showing the special masks according to the present invention.

In this second embodiment of the invention, the lead wires 4 were sealed on the ceramic substrate 2 with the ceramic cap 6 through the low-melting glass 5 as in the first embodiment but glass printing masks as shown in FIGS. 10, 11 an 12 were used in various combinations on the lead-wire attaching surface of the ceramic cap. The glass printing mask 10 of FIG. 10 is a conventional mask having an opening 10a therethrough and a centered mask portion 10b. On the other hand, the glass printing mask of FIG. 11 is a special mask 11 which has been invented to decrease bubbles. The mask 11 has protrusions 11a formed at its inner peripheral portions of an opening 11b and a central mask portion 11c. The glass printing mask 12 of FIG. 12 has protrusions 12a are formed similarly to the mask of 11 FIG. 11. The protrusions 12a project into the opening 12b that also includes a central mask portion 12c. Samples 11 through 14 were produced by using the masks in various combinations as shown in Table 4, and the amount of bubble generation was measured in the same manner as in the first embodiment. Table 5 shows the measurement results.

TABLE 4

| Sample | Kind of Mask* | | | | Baking Temperature |
|---|---|---|---|---|---|
| | First Layer* | Second Layer* | Third Layer* | Fourth Layer* | |
| 11 | 10 | 10 | 11 | 11 | 450° C. |
| 12 | 10 | 10 | 10 | 11 | 450° C. |
| 13 | 10 | 10 | 10 | 12 | 450° C. |
| 14 | 10 | 10 | 10 | 10 | 450° C. |

Figure 12:
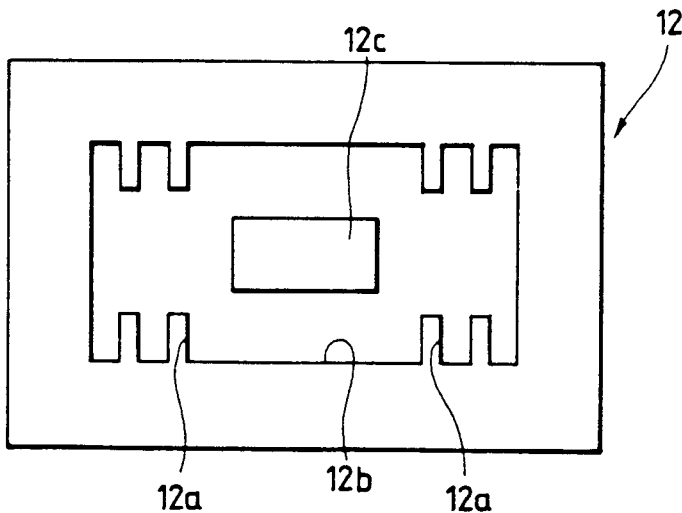
Figure 13:
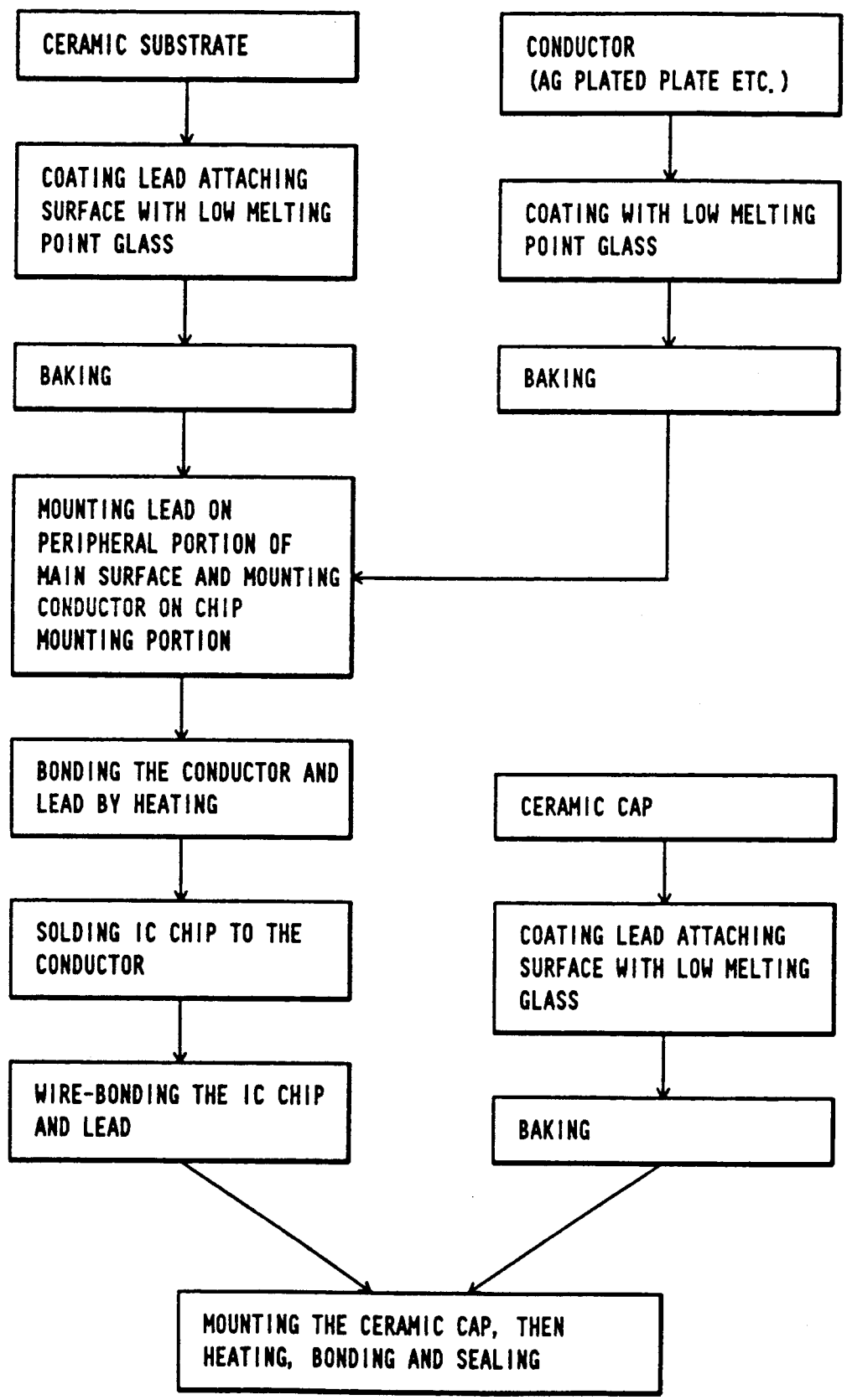
FIG. 13 is a flow chart for explaining the process for producing an IC package according to the present invention.

* Numbers in Table 4 refer to the number of the layer shown in FIGS. 10-12.

TABLE 5

| Sample | Amount of Bubble Generation (%) | | | | | | | |
|---|---|---|---|---|---|---|---|---|
| | 10 Measured Values | | | | | X | Min | Max |
| 11 | 1.4 | 1.4 | 1.9 | 1.8 | 1.5 | 1.6 | 1.3 | 1.9 |
| | 1.6 | 1.8 | 1.7 | 1.7 | 1.3 | | | |
| 12 | 1.0 | 1.6 | 1.4 | 1.2 | 1.4 | 1.3 | 1.0 | 1.6 |
| | 1.3 | 1.5 | 1.1 | 1.4 | 1.2 | | | |
| 13 | 1.7 | 1.5 | 1.2 | 1.8 | 1.6 | 1.5 | 1.1 | 1.8 |
| | 1.6 | 1.3 | 1.5 | 1.4 | 1.1 | | | |
| 14 | 6.0 | 3.0 | 5.5 | 3.0 | 4.5 | 4.9 | 3.0 | 6.5 |
| | 6.0 | 6.5 | 5.0 | 4.5 | 4.5 | | | |

As seen from Table 4 and the measurement results of Table 5, in all the samples 11 through 13 in which the special mask according to the present invention was used for the third layer and/or the fourth layer, the amount of bubble generation was considerably reduced in comparison with the sample 14 in which only the conventional mask was used for each of the first to fourth layers. Thus, it is apparent that the risk of leakage at the cap sealed portion is remarkably reduced.

Although the amount of bubble generation was shown by way of example in the foregoing embodiment where the low-melting glass 5 applied successively in two layers, the amount of bubble generation can also be reduced if the special mask 9 is used to form a single layer or three layers or more.

Further, although description has been made as to the case where an IC package or cer-dip is produced, the present invention is not limited to a cer-dip, but the present invention is applicable to the case of a display panel, a diode, or the like, to be bonded with low-melting glass.

The present invention has been disclosed in terms of several embodiments. The invention is not limited thereto and the scope of the invention is determined solely by the claims appended to the present specification.

What is claimed:

1. A method of joining two articles by means of a low-melting point glass, said method comprising the steps of:
   (a) providing a first article to be joined, said first article having a first bonding surface;
   (b) applying a layer of low-melting point glass to said first bonding surface, said layer having a plurality of open recesses in flow communication with the outer peripheral edge of said layer;
   (c) applying a second article to said layer to a low melting point glass;
   (d) heating said first and second articles and said layer of low-melting point glass to a temperature above the melting point of said glass; and
   (e) solidifying said glass to join said first and second articles.

2. The method of claim 1 wherein said recesses reduce the thickness of said low melting point glass layer adjacent the outer peripheral edge of said glass layer.

3. The method of claim 1 wherein the step of applying said low melting point glass includes forming said glass layer with a mask member, said mask member including at least one protrusion disposed to form said recesses.

4. The method of claim 1 wherein said first article is a ceramic member and said second article is a metal member.

5. The method of claim 4 wherein said metal member is an electrical lead.

6. The method of claim 4 wherein said metal member is an electrically conductive plate disposed to receive an IC chip.

* * * * *

UNITED STATES PATENT AND TRADEMARK OFFICE
CERTIFICATE OF CORRECTION

PATENT NO. : 5,006,143

DATED : April 9, 1991

INVENTOR(S) : Hideyuki Kawase, et. al.

It is certified that error appears in the above-identified patent and that said Letters Patent is hereby corrected as shown below:

Title Page, Inventors, please insert the residence fo all the inventors as --Aichi; Japan--;

Title Page, Inventors, insert as an additional inventor --Shigeo Mizuno; Aichi; Japan--; and Claim 1, Column 6, Line 24, change "to a" to --of--.

Signed and Sealed this

Twenty-sixth Day of January, 1993

Attest:

STEPHEN G. KUNIN

*Attesting Officer*     *Acting Commissioner of Patents and Trademarks*